(12) United States Patent
Seung Min

(10) Patent No.: US 9,672,877 B2
(45) Date of Patent: Jun. 6, 2017

(54) INTERFACES AND DIE PACKAGES, AND APPARATUSES INCLUDING THE SAME

(71) Applicant: Micron Technology, Inc., Boise, ID (US)

(72) Inventor: Oh Seung Min, Icheon-si (KR)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/284,214

(22) Filed: Oct. 3, 2016

(65) Prior Publication Data

US 2017/0025161 A1 Jan. 26, 2017

Related U.S. Application Data

(62) Division of application No. 14/524,779, filed on Oct. 27, 2014, now Pat. No. 9,460,762, which is a division
(Continued)

(51) Int. Cl.
*G11C 11/34* (2006.01)
*G11C 7/10* (2006.01)
(Continued)

(52) U.S. Cl.
CPC .............. *G11C 7/1084* (2013.01); *G11C 5/02* (2013.01); *G11C 7/10* (2013.01); *G11C 7/1012* (2013.01); *G11C 7/1066* (2013.01); *G11C 7/1069* (2013.01); *G11C 7/1093* (2013.01); *H01L 23/48* (2013.01); *H01L 25/0657* (2013.01); *H01L 25/18* (2013.01); *G11C 2213/71* (2013.01); *H01L 24/48* (2013.01); *H01L 24/73* (2013.01); *H01L 2224/04042* (2013.01); *H01L 2224/05553* (2013.01); *H01L 2224/05554* (2013.01);
(Continued)

(58) Field of Classification Search
CPC ............ G11C 7/10; G11C 7/12; G11C 7/1024
USPC .................... 365/174, 189.02, 219
See application file for complete search history.

(56) References Cited

U.S. PATENT DOCUMENTS 6,812,726 B1* 11/2004 Ong ................... G01R 31/2884
324/762.06
8,873,282 B2 10/2014 Min
(Continued)

*Primary Examiner* — Han Yang
(74) *Attorney, Agent, or Firm* — Schwegman Lundberg & Woessner, P.A.

(57) ABSTRACT

A memory device includes a memory die package including a plurality of memory dies, an interface device including an interface circuit, and a memory controller configured to control the interface with control data received from at least one of the plurality of memory dies. The interface device of the memory device is configured to divide and multiplex an IO channel between the memory die package and the memory controller into more than one channel using the control data receive from the at least one of the plurality of memory dies. The interface device for a memory device includes a control input buffer configured to receive an enable signal through a control pad, a first input buffer configured to receive a first data through a first IO pad in response to a first state of the enable signal, and a second input buffer configured to receive a second data through a second IO pad in response to a second state of the enable signal. The interface device further includes an input multiplexer configured to multiplex the first data and the second data to provide an input data.

9 Claims, 11 Drawing Sheets

Related U.S. Application Data of application No. 13/276,047, filed on Oct. 18, 2011, now Pat. No. 8,873,282.

(51) Int. Cl.
*H01L 23/48* (2006.01)
*H01L 25/18* (2006.01)
*G11C 5/02* (2006.01)
*H01L 25/065* (2006.01)
*H01L 23/00* (2006.01)

(52) U.S. Cl.
CPC ............ *H01L 2224/06155* (2013.01); *H01L 2224/32145* (2013.01); *H01L 2224/32225* (2013.01); *H01L 2224/48106* (2013.01); *H01L 2224/48145* (2013.01); *H01L 2224/48147* (2013.01); *H01L 2224/48225* (2013.01); *H01L 2224/48227* (2013.01); *H01L 2224/49175* (2013.01); *H01L 2224/73265* (2013.01); *H01L 2225/0651* (2013.01); *H01L 2225/06506* (2013.01); *H01L 2225/06562* (2013.01); *H01L 2924/1301* (2013.01); *H01L 2924/1434* (2013.01); *H01L 2924/15192* (2013.01)

(56) References Cited

U.S. PATENT DOCUMENTS

| | | |
|---|---|---|
| 9,460,762 B2 | 10/2016 | Seung Min |
| 2006/0126369 A1 | 6/2006 | Raghuram |
| 2007/0236249 A1 | 10/2007 | Wong |
| 2010/0078635 A1 | 4/2010 | Kuroda et al. |
| 2011/0108972 A1 | 5/2011 | Foster, Sr. et al. |
| 2011/0109381 A1 | 5/2011 | Foster, Sr. et al. |
| 2013/0094301 A1 | 4/2013 | Min |
| 2015/0043285 A1 | 2/2015 | Min |

\* cited by examiner

INTERFACES AND DIE PACKAGES, AND APPARATUSES INCLUDING THE SAME

PRIORITY APPLICATION

This application is a divisional of U.S. application Ser. No. 14/524,779, filed Oct. 27, 2014, now issued as U.S. Pat. No. 9,460,762, which is a divisional of U.S. application Ser. No. 13/276,047, filed Oct. 18, 2011, now issued as U.S. Pat. No. 8,873,282, all of which are incorporated herein by reference in their entireties.

TECHNICAL FIELD

The present disclosure relates generally to apparatuses such as memory devices and, in a particular embodiment, to an interface for use with a memory device.

BACKGROUND

There is an increasing demand for non-volatile memory devices which can be electrically programmed and erased. Non-volatile memory devices are widely used in storage media for portable electronic devices, such as digital cameras, digital televisions, personal digital assistants (PDAs), MP3 players, or the like.

To increase storage capacity, a non-volatile memory device such as a NAND flash memory may have multiple stacks of memory dies (e.g., chips) to thereby form a memory die package. The memory die package can be implemented in various forms such as a DDP (Double-Die Package), a QDP (Quad-Die Package), an ODP (Octo-Die Package), or the like, depending on the number of stacks (i.e., dies) included in the memory die package. For example, the ODP may have 8 memory dies that are stacked on a substrate. In such a structure which includes a plurality of stacked memory dies, multiple IO (input/output) channels (e.g., buses) are connected between pads of the multiple memory dies and a pad of one memory controller that may be stacked on top of the stacked memory dies.

FIG. 2 is a side view of prior art embodiment of a memory device having a memory die package and a memory controller. FIG. 3 a top view of the memory device of FIG. 2. As depicted, the memory device 200 includes a memory controller 210, a memory die package 230, and a substrate 250. The memory controller 210 may include an interface module 220 that is configured to communicate with a plurality of stacked memory dies in the memory die package 203, as shown in FIG. 3. The memory die package 230 may have 8 dies (C1 to C8) that are stacked on the substrate 250, thereby forming an ODP. A memory controller 210 may be disposed on a top memory die (i.e., the die C1) of the memory die package 230. A formation of stacking the memory dies may be determined according to various design requirements such as the dimension/size of each memory die. For example, the memory die C8 at the bottom may have the largest dimension and the dimension of the memory dies may become smaller as the memory dies are stacked. As shown in FIG. 2, the die C7 may be stacked on the die C8 in such a way that the die C7 is shifted to a right direction by a particular margin. Each of the memory dies (C1 to C8) is coupled to its adjacent memory dies, and the top die C1 is coupled to the memory controller 210. To this end, as shown in FIG. 3, a pad IO of the memory die C8 is coupled to a pad IO of an adjacent memory die (i.e., C7), and a pad IO of the memory die C7 is coupled to a pad IO of an adjacent memory die (i.e., C6), and so forth. A pad IO of a top die C1 is coupled to a pad IO of the memory controller, as shown in FIG. 3. Coupling the IO pads may be implemented using any circuit element connection technique, such as a wire connection.

However, in the above prior art embodiment, as the number of stacks increases, IO capacitance (e.g., a junction capacitance of a transistor, capacitance of metal lines, capacitance of pads in the memory device, etc.) significantly increases. The increase of capacitance in the memory device may require more current to be consumed during the operation of the memory device. In a memory reading/writing operation of a large-volume of data, current consumption becomes one of several significant factors which determines the memory operation performance. Similar problems arise when other types of die are stacked to form a die package.

DETAILED DESCRIPTION

Figure 1:
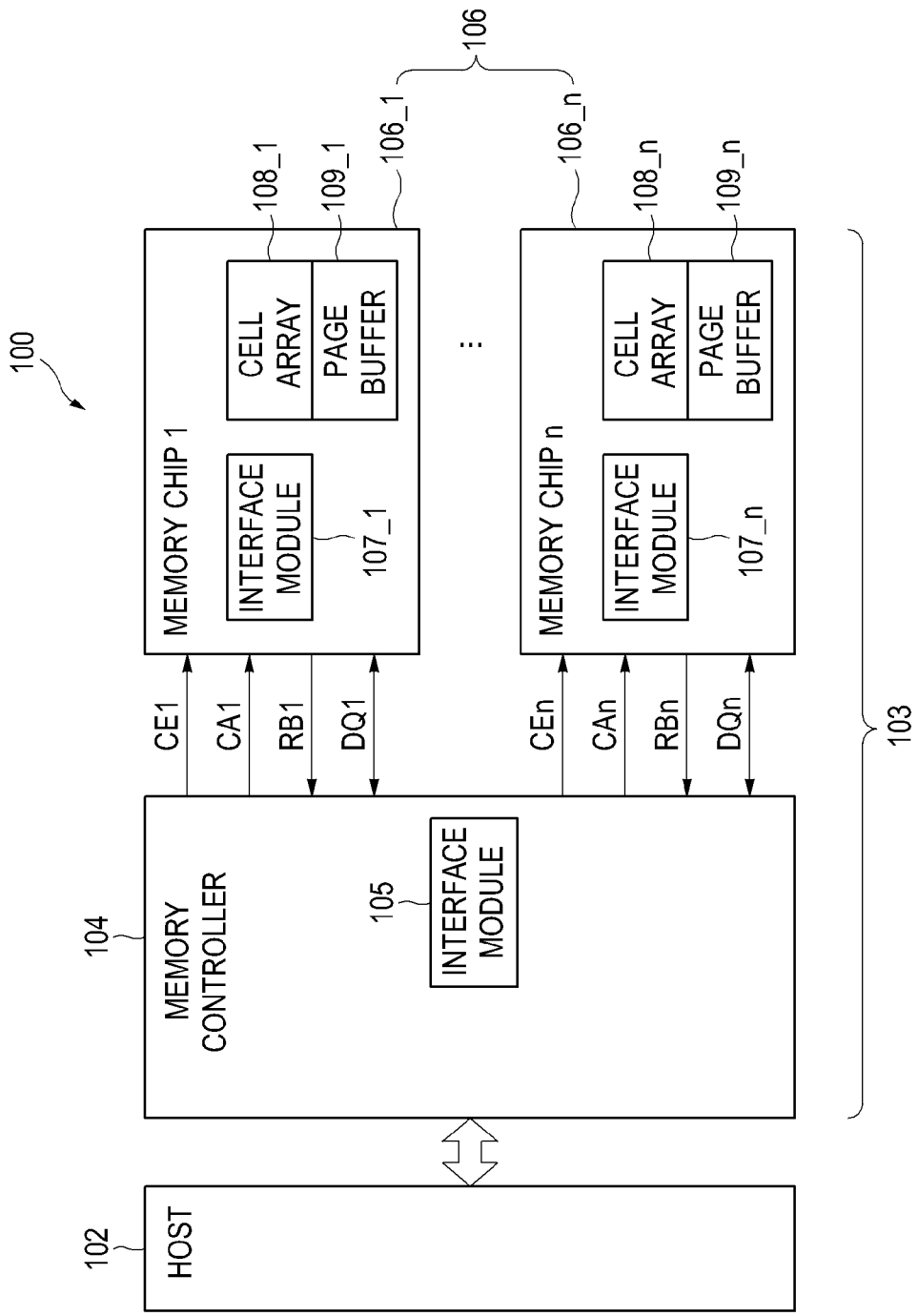
FIG. 1 is a schematic diagram of an illustrative embodiment of a storage system.
Figure 2:
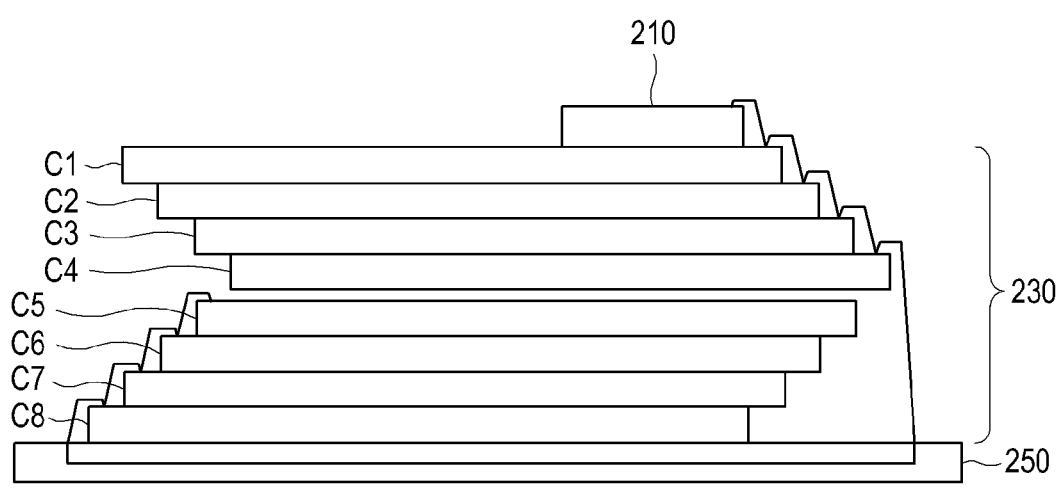
FIG. 2 is a side view of a prior art embodiment of a memory device having an ODP and a memory controller.
Figure 3:
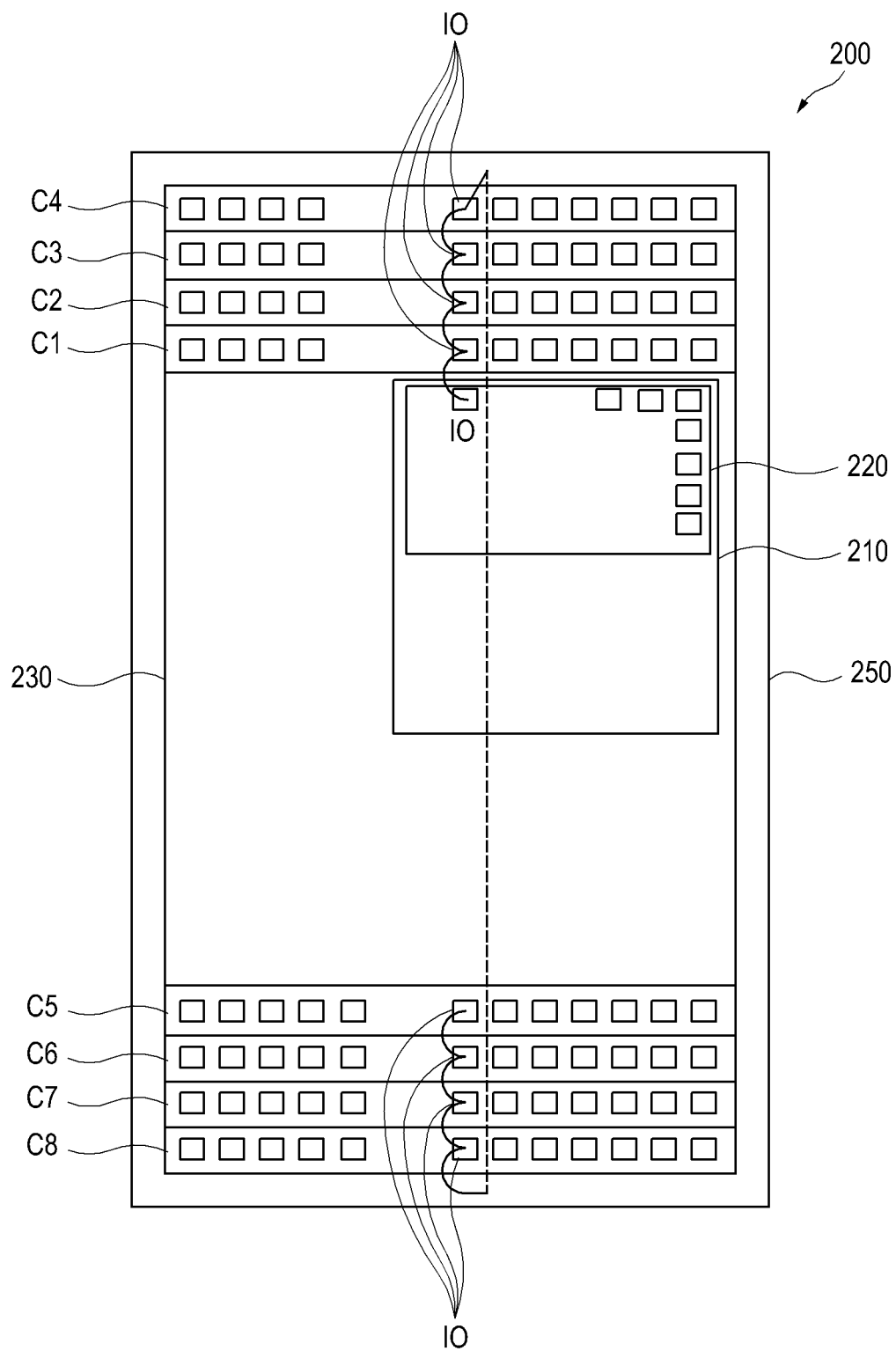
FIG. 3 a top view of the memory device of FIG. 2.

Techniques for providing an interface between a controller and a die package including a plurality of dies are provided.

In one embodiment, an apparatus may include a die package include a plurality of dies and an interface. The interface device may divide a channel between the die package and a controller into more than one channel in response to an external control signal. In another embodiment, include a die package include a plurality of dies and an interface device configured to multiplex more than one channels between the die package and a controller into a single channel in response to a control signal received from at least one of the plurality of dies. In another embodiment, an apparatus may include a controller interfaced to a plurality of dies divided into groups of dies, respective I/O buses coupling the controller to each of the groups of dies, each I/O bus decoupled from the other groups of dies. The apparatus may multiplex information exchanged with selected ones of the groups of dies on the respective I/O bus in response to a control signal.

In another embodiment, an interface device includes a plurality of input buffers including a control input buffer configured to receive an enable signal, a first input buffer configured to receive a first data and provide a first input data, and a second input buffer configured to receive a second data and provide a second input data. The interface device further includes an input multiplexer configured to multiplex the first input data and the second input data to provide integrated data in response to the enable signal. In another embodiment, an interface device may include an output multiplexer configured to divide output data to provide a first data and a second data in response to an external control signal, the output multiplexer further configured to provide a first control signal and a second control signal, a first pre-driving circuit configured to provide a first pull-up signal and a first pull-down signal in response to the first data and the first control signal, and a first output buffer configured to provide a first output data in response to the first pull-up signal and the first pull-down signal. The interface device may further include a second pre-driving circuit configured to provide a second pull-up signal and a second pull-down signal in response to the second data and the second control signal, and a second output buffer configured to provide a second output data in response to the second pull-up signal and the second pull-down signal.

In another embodiment, a memory device may include a plurality of memory dies, an interface device. The interface device may include a control input buffer configured to receive an enable signal through a control pad from a first group of the plurality of memory dies, each of the first group of memory dies being coupled to the control pad. The interface device may further include a first input buffer configured to receive a first data through a first IO pad from the first group of memory dies, each of the first group of memory dies being coupled to the first IO pad, and a second input buffer configured to receive a second data through a second IO pad from a second group of the plurality of memory dies, each of the second group of memory dies being coupled to the second IO pad. Additionally, the interface may include an input multiplexer configured to multiplex the first data and the second data to provide integrated data in response to the enable signal. In another embodiment, a memory device may include a plurality of memory dies and an interface device. The interface device may include an output multiplexer configured to divide the output data to provide a first data and a second data in response to an external control signal, the output multiplexer being further configured to provide a first control signal and a second control signal. The interface device may further include a first pre-driving circuit configured to provide a first pull-up signal and a first pull-down signal in response to the first data and the first control signal, and a first output buffer configured to provide a first output data in response to the first pull-up signal and the first pull-down signal through a first IO pad coupled to a first group of the plurality of memory dies. The interface device may further include a second pre-driving circuit configured to provide a second pull-up signal and a second pull-down signal in response to the second data and the second control signal, and a second output buffer configured to provide a second output data in response to the second pull-up signal and the second pull-down signal through a second IO pad coupled to a second group of the plurality of memory dies.

The foregoing summary is illustrative only and is not intended to be in any way limiting. In addition to the illustrative aspects, embodiments, and features described above, further aspects, embodiments, and features will become apparent by reference to the drawings and the following detailed description.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 is a schematic diagram of an illustrative embodiment of an apparatus such as a storage system that may employ an interface for dividing an IO channel between a memory controller and a plurality of stacked memory dies, and/or for multiplexing more than one channel between a memory controller and a plurality of stacked memory dies. As depicted, a storage system 100 includes a host 102, and a memory device 103. The host 102 may be implemented in the form of (or as a part of) a portable device such as a personal computer, a notebook computer, a digital camera, a cellular phone, a MP3 player, a PMP device, or the like. The memory device 103 may be implemented in the form of a memory card including, without limitation, a MMC (Multi-Media Card), SD (Secure Digital) card, XD (eXtreme Digital) card, CF (Compact Flash) card, SIM (Subscriber Identification Module) card, or the like. The host 102 is configured to issue a command to read/write data from or to the memory device 103 according to an operation request (e.g., a command from a user). For example, the host 102 may be configured to communicate with the memory device 103 through the use of a communication protocol (either wired or wireless), e.g., by employing a digital interface protocol, such as a serial port, parallel port, PS/2 port, universal serial bus (USB) link, firewire or IEEE 1394 link, or wireless interface connection, such as an infrared interface, BlueTooth®, ZigBee, high-definition multimedia interface (HDMI), high-bandwidth digital content protection (HDCP), wireless fidelity (Wi-Fi), local area network (LAN), wide area network (WAN) or the like. In this example, the memory device 103 may include a communication interface module such as a USB (Universal Serial Bus) module.

The memory device 103 includes a memory controller 104, and a memory die package 106. The memory controller 104 is configured to communicate with the host 102 to control the operations of the memory die package 106. For example, the memory controller 104 may control the read and write operations with the memory die package 106 according to the command issued from the host 102. The memory controller 104 may transfer data and control signals between the host 102 and the memory die package 106. The memory controller 104 may include an interface for dividing an IO channel and/or multiplexing IO channels between the memory controller 104 and a plurality of stacked memory dies in the memory die package 106, which will be described later in more detail. For example, the memory controller 104 may include an interface module 105 that is configured to communicate with a plurality of stacked memory dies in the memory die package 106. Although FIG. 1 shows the interface module 105 is included in the memory controller 104, the interface module 105 may be implemented as a separate device that couples the memory controller 104 and the memory dies in the memory die package 106. The memory controller 104 may be implemented using one or more microprocessors, digital signal processors (DSPs), microcontrollers, or the like. At least one system memory may be embedded in or coupled to the memory controller 104 to store and operate software applications, including an operating system, at least one application program, and other program modules, to be executed on the memory controller 104.

The memory die package 106 includes one or more memory dies (e.g., a memory die 1 106_1 to a memory die n 106_n), wherein n is an integer greater than 1. The memory die package 106 can be implemented in various forms such as a DDP (Double-Die Package), a QDP (Quad-Die Package), a ODP (Octo-Die Package), or the like, depending on the number of stacks (i.e., dies) included in the memory die package 106. For example, a memory die package (in the case of an ODP) may have 8 memory dies that are stacked on a substrate. The memory controller 104 may send a die enable signal (CE1 to CEn) to each memory die in the memory die package 106 (e.g., each of the memory die 1 106_1 to the memory die n 106_n) through the interface module 105.

The memory controller 104 may send a command and address signal (CA1 to CAn) to each memory die of the memory die package 106 (e.g., each of the memory die 1 106_1 to the memory die n 106_n). Each memory die in the memory die package 106 (e.g., each of the memory die 1 106_1 to the memory die n 106_n) may send a return signal (RB1 to RBn) to the memory controller 104. The memory controller 104 may exchange storage data (DQ1 to DQn) with each memory die in the memory die package 106 (e.g., each of the memory die 1 106_1 to the memory die n 106_n). For example, the storage data (DQ1 to DQn) may include read/write data that are read from or to be written to the memory die package 106.

Each memory die in the memory die package 106 may include a cell array and a page buffer. As shown in FIG. 1, the memory die 1 106_1 includes a cell array 108_1 and a page buffer 109_1. The cell array 108_1 includes multiple cells, each being configured to store data. The page buffer 109_1 may temporarily store data to be stored into the cell array 108_1 or data that is read out from the cell array 108_1. For example, if the memory die 1 106_1 receives storage data DQ1 from the memory controller 104, then the cell array 108_1 may store the storage data DQ1 into one of the cells therein, the address of which may be determined based on a command and address included in the CA1 signal. Each of the memory dies (106_1 to 106_n) in the memory die package 106 may include an interface module (107_1 to 107_n) that is configured to communicate with the interface module 105 of the memory controller 104. The interface module (107_1 to 107_n) of the memory die package 106 may form one or more IO channels in combination with the interface module 105 of the memory controller 104.

It should be appreciated that the memory device 103 may include one or more non-volatile memory devices, or any other type of memory devices that can store, program and erase data. For example, the memory device 103 may include, but not be limited to, a NAND memory, a NOR memory, a DRAM memory, a SRAM memory, a PCM memory, a RRAM memory, a TRAM memory, a MRAM memory, or the like.

In the following, some embodiments of a memory device will be described where IO channels are provided between a memory controller and a memory die package including multiple stacks of memory dies.

Figure 4:
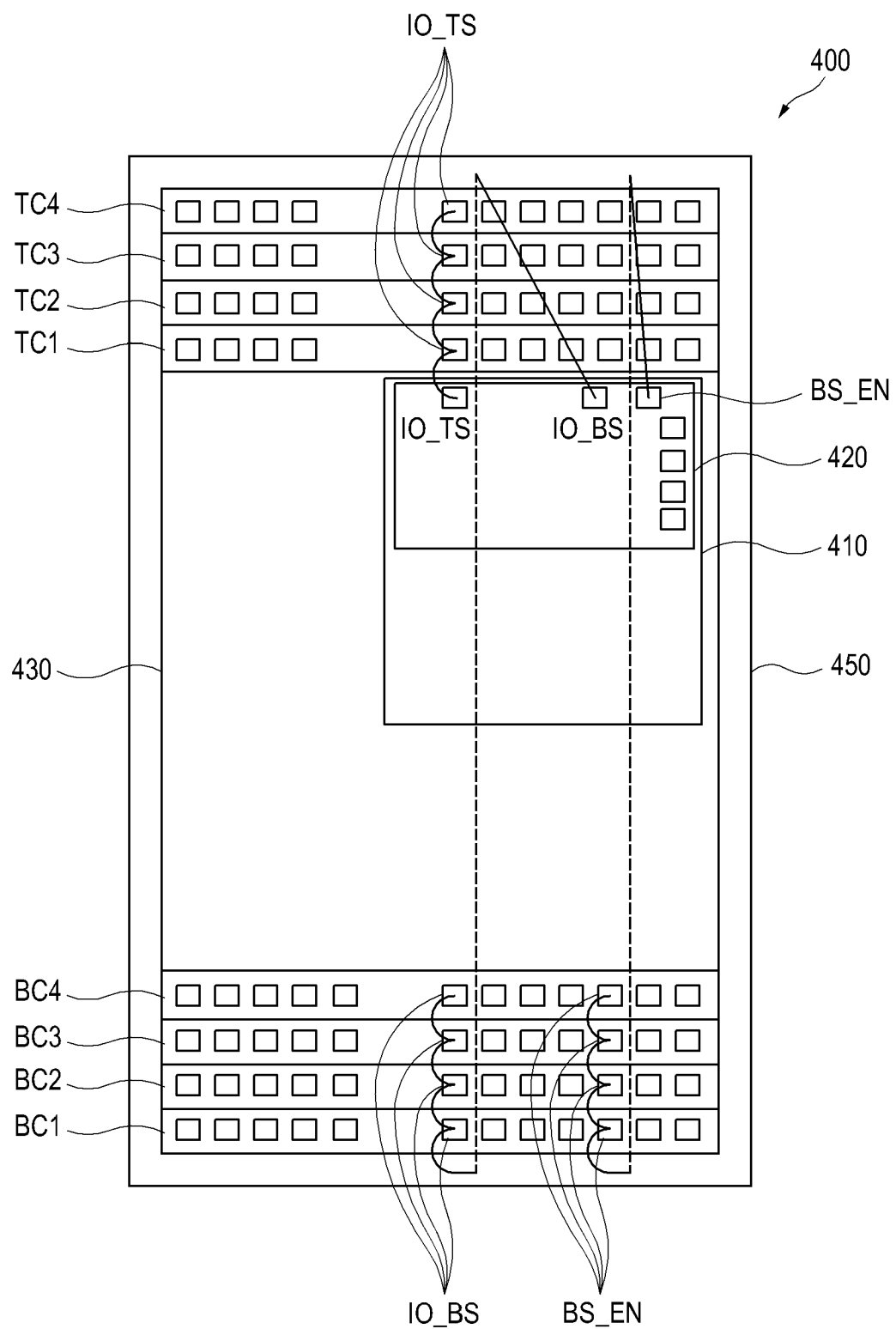
FIG. 4 is a top view of another illustrative embodiment of the memory device having an ODP and a memory controller.
Figure 5:
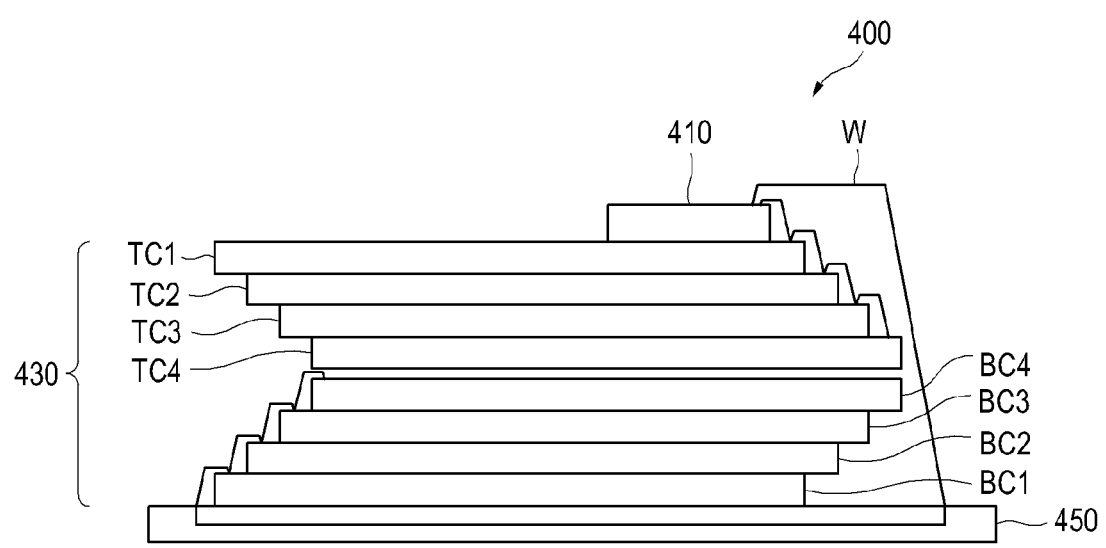
FIG. 5 is a side view of an illustrative embodiment of the memory device of FIG. 4.
Figure 8:
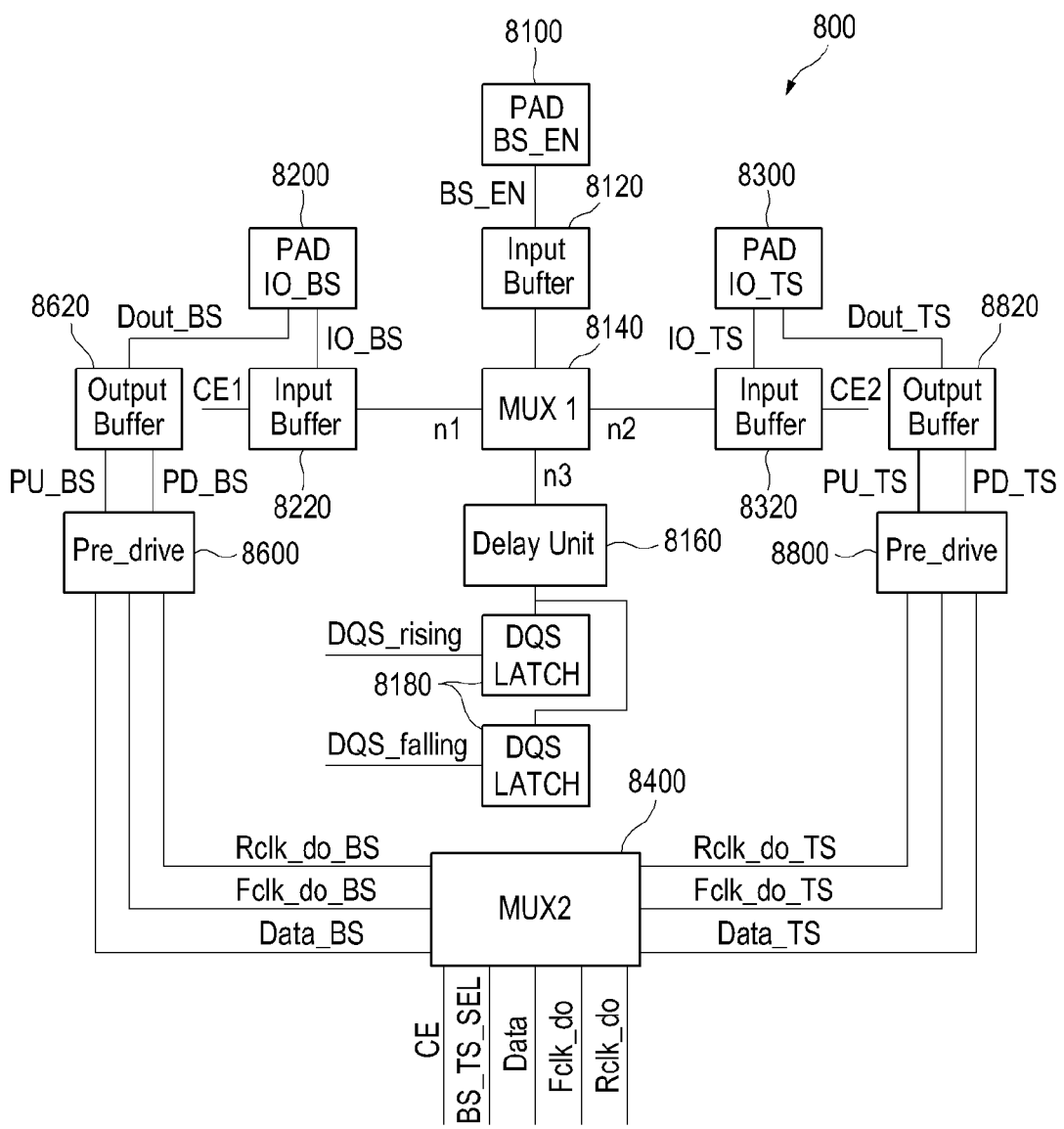
FIG. 8 is a schematic diagram of an illustrative embodiment of an interface circuit for a memory device.

FIG. 4 is a top view of another illustrative embodiment of another apparatus, such as a device (e.g., the memory device 103 of FIG. 1) having a die package and a controller. FIG. 5 is a side view of the device of FIG. 4. As depicted, the device 400 includes a controller 410 and a die package 430. In one embodiment, the controller 410 and the die package 430 may include the same configuration as the memory controller 104 and memory die package 106, which are described above with reference to FIG. 1. The die package 430 may include multiple memory dies that are stacked on a substrate 450. The die package 430 may include one or more groups of memory dies. Each group of dies includes at least one die and there may be several groups of dies in the memory die package. For example, the die package 430 may include a first group of memory dies that are disposed in a lower portion (or "bottom side") of the die package 430, and a second group of memory dies that are disposed in an upper portion (or "top side") of the die package 430. In this example, the second group of memory dies may be disposed on the first group of memory dies. The memory device according to this embodiment may employ an interface 420 (e.g., an interface module as shown in FIG. 8, which will be described later in detail) configured to selectively connect an IO channel between the memory controller 410 and the groups of memory dies in the die package 430. Although FIG. 4 shows the interface 420 is included in the memory controller 410, the interface 420 may be implemented as a separate device that couples the memory controller 410 and the memory dies in the memory die package 430.

In one embodiment, the memory die package 430 may have 8 memory dies that are stacked on the substrate 450, as shown in FIG. 5. The four memory dies (BC1, BC2, BC3, BC4) are stacked in the lower portion of the memory die package 430 to thereby form the first group of memory dies. A first bottom memory die BC1 is disposed on a substrate 450, and a second bottom memory die BC2 is disposed on the first bottom memory die BC1 at a position that is shifted to the right side by a particular margin. The margin may be determined according to the design requirements of the memory device (e.g., dimension/size of each memory die and/or size/position of bonding pads). For example, the margin may have the value of 1/16 of a horizontal dimension (length) of each memory die. A third bottom memory die BC3 is disposed on the second bottom memory die BC2 at a position that is shifted to the right side by a particular margin, and a fourth bottom memory die BC4 is disposed on the third bottom memory die BC3 at a position that is shifted to the right side by a particular margin. The four memory dies (TC4, TC3, TC2, TC1) are stacked in the upper portion of the memory die package 430 to thereby form the second group of memory dies. A fourth top memory die TC4 is disposed on the fourth bottom memory die BC4, and a third top memory die TC3 is disposed on the fourth top memory die TC4 at a position that is shifted to the left side by a particular margin. A second top memory die TC2 is disposed on the third top memory die TC3 at a position that is shifted to the left side by a particular margin, and a first top memory die TC1 is disposed on the second top memory die TC2 at a position that is shifted to the left side by a particular margin. The memory controller 410 is disposed on the first top memory die TC1. Although FIGS. 4 and 5 show the memory die package 430 including 8 dies to form a ODP (Octo-Die Package), the memory die package 430 can be implemented as a DDP (Double-Die Package), QDP (Quad-Die Package), or the like depending on the number of stacks (i.e., dies) included in the memory die package 430. Although in this embodiment the four memory dies (TC4, TC3, TC2, TC1) are stacked in the upper portion of the memory die package 430 while the four memory dies (BC1, BC2, BC3, BC4) are stacked in the lower portion thereof, any other topological arrangement of the memory dies may be applied. For example, the four memory dies (TC4, TC3, TC2, TC1) may be stacked in the lower portion of the memory die package 430 while the four memory dies (BC1, BC2, BC3, BC4) may be stacked in the upper portion thereof.

The memory controller 410 may include a plurality of IO pads. For example, as shown in FIG. 4, the memory controller 410 may include a first IO pad IO_BS, a second IO pad IO_TS, and a control pad BS_EN. Each of the bottom memory dies (BC1, BC2, BC3, BC4) includes a respective IO pad IO_BS and a respective control pad BS_EN. The first IO pad IO_BS of the memory controller 410 may be coupled to each corresponding IO pad IO_BS of the bottom memory dies (BC1, BC2, BC3, BC4). The control pad BS_EN of the memory controller 410 may be coupled to each control pad BS_EN of the bottom memory dies (BC1, BC2, BC3, BC4). In the meantime, each of the top memory dies (TC1, TC2, TC3, TC4) includes a respective IO pad IO_TS. The second IO pad IO_TS of the memory controller 410 may be coupled to each corresponding IO pad IO_TS of the top memory dies (TC1, TC2, TC3, TC4). The connection between the memory dies and the memory controller 410 may be implemented using any techniques used for coupling components/elements, and particularly those used in semiconductor device fabrication. In another embodiment, the dies stacked in the die package 430 are grouped in a plurality of groups of dies, e.g. 4 or 8 groups. The controller includes an IO pad dedicated to each group and coupled to respective IO pads in the dies of the group. The control pad BS_EN includes a plurality of control pads configured to select one among the groups of dies, e.g. by logic combination of signals.

Figure 6:
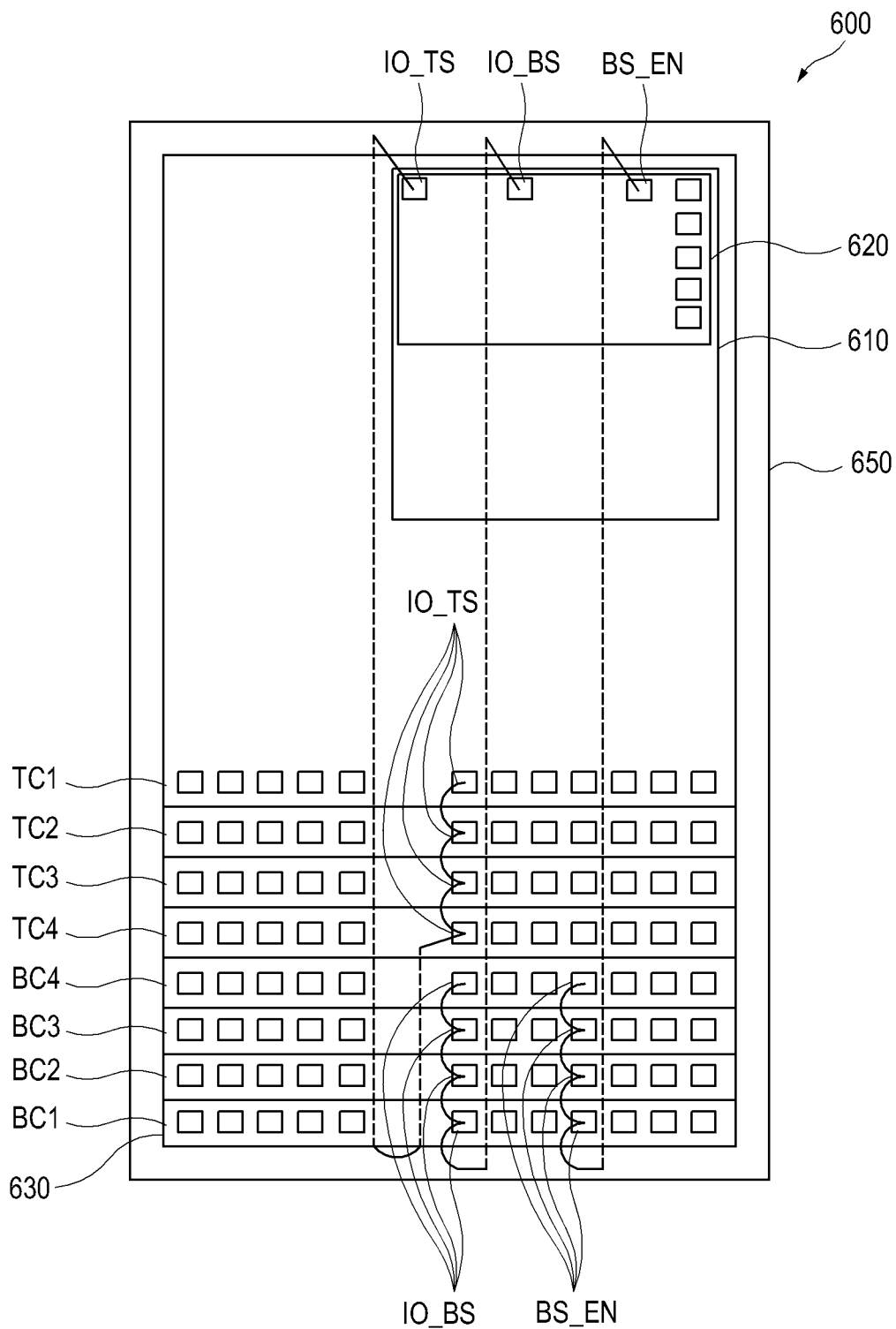
FIG. 6 is a top view of yet another illustrative embodiment of the memory device having an ODP and a memory controller.
Figure 7:
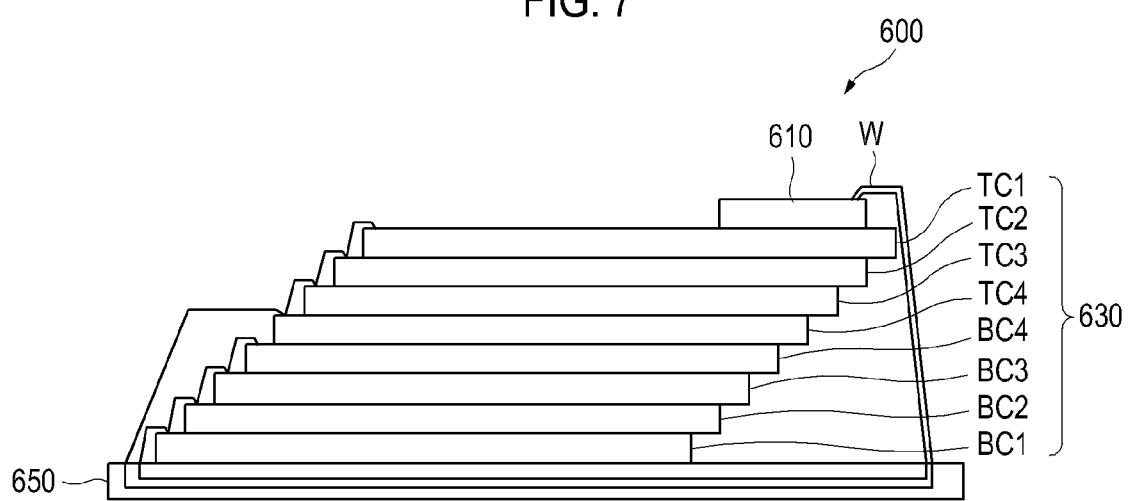
FIG. 7 is a side view of an illustrative embodiment of the memory device of FIG. 6.

FIG. 6 is a top view of yet another illustrative embodiment of an apparatus, such as a device having a die package and a controller (e.g., the memory device 103 of FIG. 1). FIG. 7 is a side view of an illustrative embodiment of the apparatus of FIG. 6. As depicted, the apparatus comprises a memory device 600 that includes a memory controller 610 and a memory die package 630. The memory die package 630 may include multiple memory dies (e.g., 8 memory dies) that are stacked on a substrate 650, as shown in FIG. 7. In one embodiment the memory controller 610 and the memory die package 630 may include the same configuration as the memory controller 104 and memory die package 106, which are described above with reference to FIG. 1. A first bottom memory die BC1 is disposed on a substrate 650, and a second bottom memory die BC2 is disposed on the first bottom memory die BC1 at a position that is shifted to the right side by a particular margin. A third bottom memory die BC3 is disposed on the second bottom memory die BC2 at a position that is shifted to the right side by a particular margin, and a fourth bottom memory die BC4 is disposed on the third bottom memory die BC3 at a position that is shifted to the right side by a particular margin. Subsequently, a fourth top memory die TC4 is disposed on the fourth bottom memory die BC4 at a position that is shifted to the right side by a particular margin, and a third top memory die TC3 is disposed on the fourth top memory die TC4 at a position that is shifted to the right side by a particular margin. A second top memory die TC2 is disposed on the third top memory die TC3 at a position that is shifted to the right side by a particular margin, and a first top memory die TC1 is disposed on the second top memory die TC2 at a position that is shifted to the right side by a particular margin. The memory controller 610 is disposed on the first top memory die TC1. The memory device according to this embodiment may employ an interface 620 (e.g., an interface module as shown in FIG. 8, which will be described later in detail) configured to selectively connect an IO channel between the memory controller 610 and the groups of memory dies (e.g., one group of bottom memory dies and another group of top memory dies) in the memory die package 630. Although FIG. 6 shows the interface 620 is included in the memory controller 610, the interface 420 may be implemented as a separate device that couples the memory controller 410 and the memory dies in the memory die package 630.

As shown in FIG. 6, the memory controller 610 may include a first IO pad IO_BS, a second IO pad IO_TS, and a control pad BS_EN. Each of the top memory dies (TC1, TC2, TC3, TC4) includes a respective IO pad IO_TS. Each of the bottom memory dies (BC1, BC2, BC3, BC4) includes a respective IO pad IO_BS and a respective control pad BS_EN. The first IO pad IO_BS of the memory controller 610 may be coupled to each corresponding IO pad IO_BS of the bottom memory dies (BC1, BC2, BC3, BC4). The control pad BS_EN of the memory controller 610 may be coupled to each control pad BS_EN of the bottom memory dies (BC1, BC2, BC3, BC4). The second IO pad IO_TS of the memory controller 610 may be coupled to each corresponding IO pad IO_TS of the top memory dies (TC1, TC2, TC3, TC4).

FIG. 8 is a schematic diagram of an illustrative embodiment of an interface module (e.g., circuit 800) for a memory device. In one embodiment, the interface circuit 800 may be employed as a part of or separately from a memory controller of the memory device (e.g., memory controllers as shown in FIGS. 1 and 4 to 7) to selectively connect an IO channel between the memory controller and more than one group of memory dies (e.g., one group of bottom memory dies and another group of top memory dies as described in the above embodiments). An interface circuit according to one embodiment may be configured to divide an IO channel between the die package and the memory controller into more than one channel, each of which is connected between the memory controller and a respective group of the multiple stacks of the memory dies. For example, the IO channel for the multiple stacks of memory dies are divided (e.g., separated) into two IO channels. One of the two IO channels may be connected between a first IO pad of the memory controller and corresponding IO pads of one group of memory dies, such as those disposed in a lower portion of the memory device. On the other hand, the other IO channel may be connected between a second IO pad of the memory controller and corresponding IO pads of another group of memory dies, such as those disposed in an upper portion of the memory device. It should be appreciated that, as in several of the embodiments described above, coupling the IO pads and/or the control pads may be implemented using any circuit element connection technique, such as a wire connection and/or a trace in the substrate and/or a direct connection between the memory controller and each of the groups of memory dies (e.g., wire connection W as indicated in FIGS. 5 and 7).

As depicted, the interface circuit 800 includes a control pad BS_EN 8100, a first IO pad IO_BS 8200, and a second IO pad IO_TS 8300. The first IO pad IO_BS 8200 may be coupled to a first group of memory dies (e.g., BC1, BC2, BC3, BC4 in FIGS. 4 and 6) of the memory die package 106. The second IO pad IO_TS 8300 may be coupled to a second group of memory dies (e.g., TC1, TC2, TC3, TC4 in FIGS. 4 and 6) of the memory die package 106. The control pad BS_EN 8100 of the interface circuit 800 may be coupled to the second group of memory dies (e.g., BC1, BC2, BC3, BC4 in FIGS. 4 and 6) of the memory die package 106. The interface circuit 800 may further include multiple input buffers, including a control input buffer 8120, a first input buffer 8220, a second input buffer 8320. The control input buffer 8120 is configured to receive an enable signal BS_EN through a control pad BS_EN. The first input buffer 8220 is configured to provide (e.g., apply, generate, output, send, transmit, etc.) a first input data n1 in response to receiving the first data IO_BS and/or a die enable signal CE1. The second input buffer 8320 is configured to generate a second input data n2 in response to receiving the second data IO_TS and/or a die enable signal CE2. The interface circuit 800 may further include an input multiplexer (MUX 1) 8140, a delay unit 8160 and a latch unit 8180. The MUX1 8140 includes any type of circuit elements/components that can multiplex one or more input data to generate an integrated output data. The delay unit 8160 and the latch unit 8180 may be implemented using any delay and buffering techniques known in the art.

Figure 9:
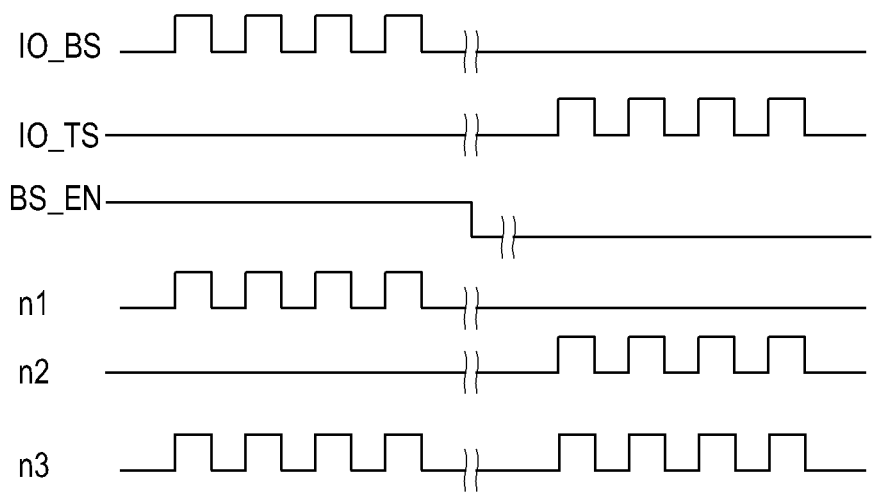
FIG. 9 shows a waveform of a control signal and data when the data is provided from an ODP to a memory controller of a memory device.

The data input operation of a memory device (e.g., with configurations as described above with reference to FIGS. 1 and 4 to 7) in one embodiment is described below with reference to FIGS. 8 and 9. FIG. 9 shows waveforms of a control signal (e.g., enable signal BS_EN) and data (n1, n2 and n3) when data (IO_BS and IO_TS) are provided from a memory die package (e.g., ODP) to a memory controller of the memory device (e.g., the memory device 400 of FIG. 4, the memory device 600 of FIG. 6, or the like). The control input buffer 8120 is configured to receive an enable signal BS_EN through a control pad BS_EN 8100 from a first group of memory dies of the memory die package (e.g., the memory die package 106 as shown in FIG. 1). For example, the first group of memory dies may include one or more memory dies (e.g., BC1, BC2, BC3, BC4) that are placed in the lower portion of the memory die package. The first input buffer 8220 is configured to receive a first data IO_BS through the first IO pad IO_BS 8200 and provide a first input data n1. For example, the first input buffer 8220 may receive the first data IO_BS from the first group of memory dies. The second input buffer 8320 is configured to receive a second data IO_TS through the second IO pad IO_TS 8300 from the second group of memory dies (e.g., TC1, TC2, TC3, TC4) and provide a second input data n2. In this way, the interface circuit 800 is configured to alternate receiving the first data IO_BS and receiving the second data IO_TS.

In some embodiments, the first input buffer 8220 may be configured to receive a first die enable signal CE1 from a first group of memory dies of the memory die package (e.g., 430 of FIG. 5 or 630 of FIG. 7). The first input buffer 8220 may generate a first input data n1 in response to receiving the first die enable signal CE1. The first die enable signal CE1 may indicate that one or more die in the first group of memory dies (e.g., BC1, BC2, BC3, BC4) is enabled to send data to the memory controller (e.g., the memory controller of FIG. 4 or FIG. 6) through the first IO pad IO_BS. The second input buffer 8320 is configured to receive a second die enable signal CE2 from the second group of memory dies of a memory die package (e.g., 430 of FIG. 5 or 630 of FIG. 7). The second input buffer 8320 may generate a second input data n2 in response to receiving the second die enable signal CE2. The second die enable signal CE2 may indicate that one or more of the second group of memory dies (e.g., TC1, TC2, TC3, TC4) is enabled to send data to the memory controller (e.g., the memory controller of FIG. 4 or FIG. 6) through the second IO pad IO_TS.

The input multiplexer 8140 is configured to multiplex the first input data n1 and the second input data n2 to generate integrated data n3. The delay unit 8160 is configured to delay the transfer of the integrated data n3. The latch unit 8180 is configured to store the delayed integrated data in response to a rising time reference signal DQS_rising and falling time reference signal DQS_falling.

Figure 10:
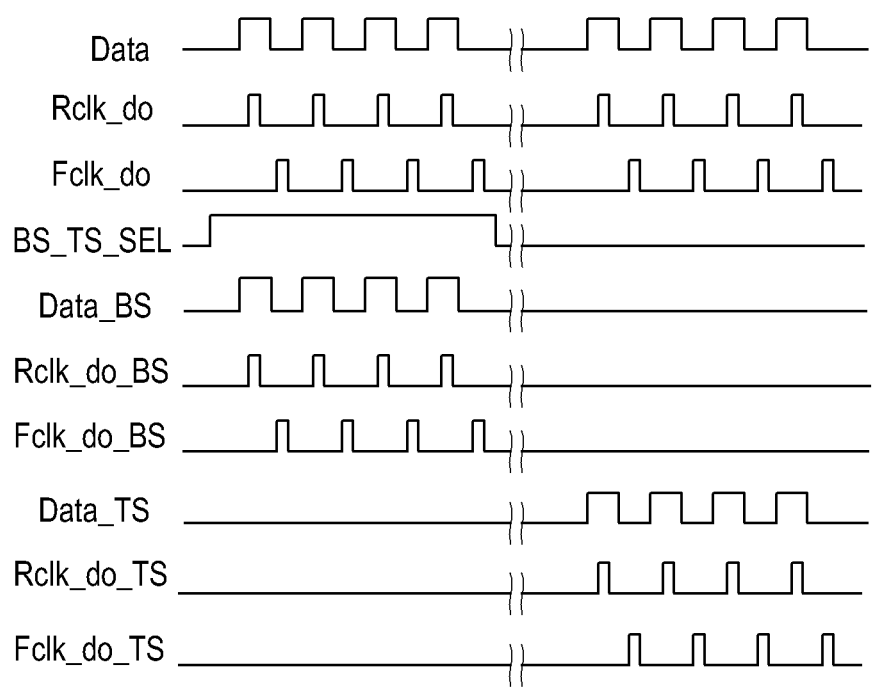
FIG. 10 shows a waveform of control signals and data when the data is provided from a memory controller to an ODP of a memory device.

Returning back to FIG. 8, the interface circuit 800 may include an output multiplexer (MUX 2) 8400, a first pre-driving circuit 8600, a first output buffer 8620, a second pre-driving circuit 8800, and a second output buffer 8820. FIG. 10 shows waveforms of control signals and data when the data are outputted from a memory controller to the memory die package in the memory device. The data output operation of the memory device in one embodiment is described below with reference to FIGS. 8 and 10.

The output multiplexer 8400 is configured to receive output data Data and a selection signal BS_TS_SEL, e.g., from a memory controller. The selection signal may have one or more states, e.g., a first state of HIGH and a second state of LOW. The output multiplexer 8400 may receive a die enable signal CE from each of the memory dies in the memory die package that are in communication with the interface circuit 800. The die enable signal CE may indicate one or more memory dies that are enabled (e.g., operating to send or receive data) among the memory dies in the memory die package. For example, the die enable signal CE may identify a memory die or a group of memory dies in the memory die package. In this example, the die enable signal CE includes multiple indicators E1, E2, E3, E4, E5, E6, E7, E8 to identify the memory dies BC1, BC2, BC3, BC4, TC1, TC2, TC3, TC4, respectively. When the indicator E1 is set HIGH, the output multiplexer 8400 may determine that the memory die BC1 is enabled.

The output multiplexer 8400 may divide a channel into more than one channel. For example, the output multiplexer may divide the output data Data to selectively generate a first data Data_BS and a second data Data_TS in response to an external control signal, such as the selection signal BS_TS_SEL and/or the die enable signal CE. The output multiplexer 8400 may receive a falling time reference signal Fclk_do and a rising time reference signal Rclk_do to thereby generate a first control signal (e.g., Fclk_do_BS, Rclk_do_BS) and a second control signal (e.g., Fclk_do_TS, Rclk_do_TS). For example, the falling time reference signal Fclk_do and the rising time reference signal Rclk_do may be generated from a clock generator (not shown) and applied to the output multiplexer 8400 along with the output data Data. The output multiplexer 8400 is configured to generate and output the first data Data_BS and the first control signal (Fclk_do_BS, Rclk_do_BS) in response to the first state (e.g., a voltage level of HIGH) of the selection signal BS_TS_SEL, as shown in FIG. 10. The output multiplexer 8400 is configured to generate and output the second data Data_TS and the second control signal (Fclk_do_TS, Rclk_do_TS) in response to the second state (e.g., a voltage level of LOW) of the selection signal BS_TS_SEL.

In some embodiments, the output multiplexer 8400 may determine whether the memory die indicated by an active die enable signal CE is included in a first group of memory dies in the memory die package or in a second group of memory dies in the memory die package. For example, the output multiplexer 8400 may determine that one memory die out of the first group of the memory dies (BS1, BS2, BS3, BS4) is enabled if at least one of the multiple indicators E1, E2, E3, E4 of the die enable signal CE is set HIGH. When the output multiplexer 8400 determines that one memory die out of the first group of the memory dies (BS1, BS2, BS3, BS4) is enabled, the output multiplexer 8400 is configured to generate and output the first data Data_BS and the first control signal (Fclk_do_BS, Rclk_do_BS). On the other hand, the output multiplexer 8400 may determine that one memory die out of the second group of the memory dies (TS1, TS2, TS3, TS4) is enabled if at least one of the multiple indicators E5, E6, E7, E8 of the die enable signal CE is set HIGH. When the output multiplexer 8400 determines that one memory die out of the second group of memory dies (TS1, TS2, TS3, TS4) is enabled, the output multiplexer 8400 is configured to generate and output the second data Data_TS and the second control signal (Fclk_do_TS, Rclk_do_TS).

The first pre-driving circuit 8600 is configured to generate a first pull-up signal PU_BS and a first pull-down signal PD_BS in response to the first data Data_BS and the first control signal (Fclk_do_BS, Rclk_do_BS). The first output buffer 8620 is configured to output a first output data $D_{out}$_BS in response to the first pull-up signal PU_BS and the first pull-down signal PD_BS. The interface circuit 800 may output the first output data $D_{out}$_BS through the first pad IO_BS 8200 to an external device (e.g., a memory die package). The second pre-driving circuit 8800 is configured to generate a second pull-up signal PU_TS and a second pull-down signal PD_TS based on the second data Data_TS and the second control signal (Fclk_do_TS, Rclk_do_TS). The second output buffer 8820 is configured to output a second output data $D_{out}$_TS in response to the first pull-up signal PU_BS and the first pull-down signal PD_BS. The interface circuit 800 may output the second output data $D_{out}$_TS through the second pad IO_TS 8300 to an external device (e.g., a memory die package). In this way, the interface circuit 800 is configured to alternate transmitting the first data Data_BS and transmitting the second data Data_TS based on the selection signal BS_TS_SEL and/or the die enable signal CE. In some embodiments, the transmitted data Data_BS and/or Data_TS are synchronized with control signal(s) Rclk_do and Flck_do. In one embodiment, the input and/or output data are multiplexed from/to a number of channels larger than two, based on a configuration of control signals, e.g. by logic combination of signals.

Figure 11:
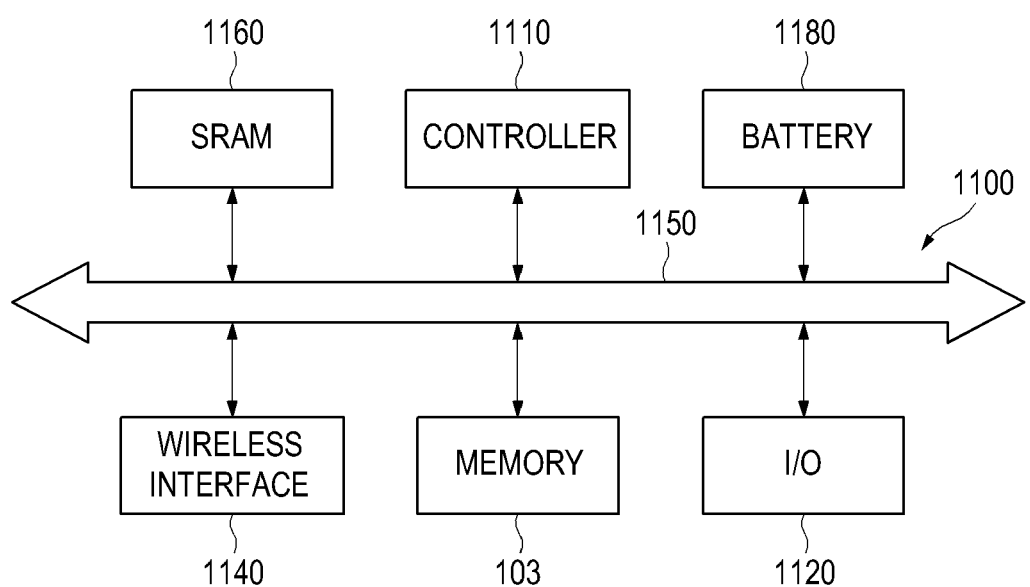
FIG. 11 is a schematic diagram of an illustrative embodiment of a system including a non-volatile memory device.

FIG. 11 shows a schematic diagram of an illustrative embodiment of an apparatus such as a system including a non-volatile memory device (e.g., a memory device 103 of FIG. 1). System 1100 may be used in devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information either wirelessly or over a wire connection. The system 1100 may be used in any of the following systems: a wireless local area network (WLAN) system, a wireless personal area network (WPAN) system, or a cellular network.

The system 1100 may include a controller 1110, an input/output (I/O) device 1120 (e.g., a keypad, display), the memory device 103 of FIG. 1, a wireless interface 1140, and a static random access memory (SRAM) 1160, each being coupled to each other via a bus 1150. A battery 1180 may supply power to the system 1100 in one embodiment. The memory device may include a NAND memory, a NOR memory, a PCM memory, a DRAM memory, a SRAM memory, a TRAM memory, a RRAM memory, a MRAM memory or the like.

Controller 1110 may comprise, for example, one or more microprocessors, digital signal processors, micro-controllers, or the like. The memory device 103 may be used to store messages transmitted to or by the system 1100. The memory device 103 may also optionally be used to store instructions that are executed by controller 1120 during the operation of system 1100, and may be used to store user data either generated or collected or received by system 1100 (such as image data). The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information.

The I/O device 1120 may be used to generate a message. The system 1100 may use the wireless interface 1140 to transmit and receive messages to and from a wireless communication network with a radio frequency (RF) signal. Examples of the wireless interface 1140 may include an antenna, or a wireless transceiver, such as a dipole antenna, although the scope of the present invention is not limited in this respect. Also, the I/O device 1120 may deliver a voltage reflecting what is stored as either a digital output (if digital information was stored), or as analog information (if analog information was stored). While an example in a wireless application is provided above, embodiments of the present invention may also be used in non-wireless applications as well.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods or apparatuses, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," or the like include the number recited and refer to ranges which can be subsequently broken down into subranges as discussed above.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An interface device, comprising:
    a control input buffer configured to receive an enable signal;
    a first input buffer configured to receive first data and provide first input data;
    a second input buffer configured to receive second data and provide second input data; and
    an input multiplexer configured to multiplex the first input data and the second input data to provide integrated data in response to the enable signal.

2. The interface device of claim 1, wherein the device is configured to alternate receiving the first data through the first input buffer and receiving the second data through the second input buffer.

3. The interface device of claim 1, further comprising:
    a delay unit configured to provide a delay to the integrated data; and
    a latch unit configured to store the delayed integrated data.

4. The interface device of claim 1, wherein the first input buffer is configured to receive a first die enable signal and to provide the first input data in response to receiving the first die enable signal, and the second input buffer is configured to receive a second die enable signal and to provide the second input data in response to receiving the second die enable signal.

5. The interface device of claim 1, further comprising:
    a first input/output (IO) pad configured to receive the first data from a first group of dice in die package; and
    a second IO pad configured to receive the second data from a second group of dice in the die package.

6. A memory device, comprising:
    a plurality of memory dice; and
    an interface device having
        a control input buffer configured to receive an enable signal through a control pad from a first group of the plurality of memory dice, each of the first group of memory dice being coupled to the control pad,
        a first input buffer configured to receive first data through a first input/output (IO) pad from the first group of memory dice, each of the first group of memory dice being coupled to the first IO pad,
        a second input buffer configured to receive second data through a second IO pad from a second group of the plurality of memory dice, each of the second group of memory dice being coupled to the second IO pad, and
        an input multiplexer configured to multiplex the first data and the second data to provide integrated data in response to the enable signal.

7. A memory device, comprising:
    a plurality of memory dice; and
    an interface device having
        an output multiplexer configured to divide the output data to provide first data and second data in response to an external control signal, the output multiplexer being further configured to provide a first control signal and a second control signal;
        a first pre-driving circuit configured to provide a first pull-up signal and a first pull-down signal in response to the first data and the first control signal;
        a first output buffer configured to provide a first output data in response to the first pull-up signal and the first pull-down signal through a first input/output (IO) pad coupled to a first group of the plurality of memory dice;
        a second pre-driving circuit configured to provide a second pull-up signal and a second pull-down signal in response to the second data and the second control signal; and
        a second output buffer configured to provide a second output data in response to the second pull-up signal and the second pull-down signal through a second IO pad coupled to a second group of the plurality of memory dice.

8. A memory apparatus, comprising:
a controller interfaced to a plurality of dice divided into groups of dice; and
respective input/output (IO) buses to couple the controller to each of the groups of dice, each IO bus being decoupled from other groups of dice, the memory apparatus being configured to multiplex information exchanged with selected ones of the groups of dice on the respective IO bus in response to a control signal.

9. An interface device couplable between a controller and a plurality of groups of circuits, the interface device comprising:
a control input buffer configured to receive an enable signal from the controller, the controller having a channel to couple with the interface device;
a first input buffer configured to receive first data and provide first input data;
a second input buffer configured to receive second data and provide second input data; and
an input multiplexer configured to multiplex the first input data and the second input data to provide integrated data in response to the enable signal, the input multiplexer being further configured to select one channel from a number of channels, the number of channels corresponding to a respective one of the plurality of groups of circuits, the input multiplexer to couple the selected one channel to the controller at a time.

* * * * *